(12) United States Patent
Tanimoto

(10) Patent No.: US 8,987,838 B2
(45) Date of Patent: Mar. 24, 2015

(54) FIELD-EFFECT TRANSISTOR

(71) Applicant: Nichia Corporation, Anan-shi (JP)

(72) Inventor: Masashi Tanimoto, Komatsushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/303,542

(22) Filed: Jun. 12, 2014

(65) Prior Publication Data

US 2014/0367797 A1    Dec. 18, 2014

(30) Foreign Application Priority Data

Jun. 14, 2013    (JP) .................................. 2013-126101

(51) Int. Cl.
| | |
|---|---|
| H01L 29/76 | (2006.01) |
| H01L 29/417 | (2006.01) |
| H01L 27/105 | (2006.01) |
| H01L 29/423 | (2006.01) |

(52) U.S. Cl.
CPC ........ H01L 29/41775 (2013.01); H01L 27/105 (2013.01); H01L 29/42356 (2013.01)
USPC .......................................................... 257/401

(58) Field of Classification Search
USPC .................. 257/350, 288, 341, 401
See application file for complete search history.

(56) References Cited

U.S. PATENT DOCUMENTS

| | | | | |
|---|---|---|---|---|
| 7,038,296 | B2* | 5/2006 | Laws | ............................ 257/534 |
| 8,053,846 | B2* | 11/2011 | Cha et al. | ...................... 257/401 |
| 8,664,729 | B2* | 3/2014 | Jou et al. | ........................ 257/401 |
| 2004/0206983 | A1 | 10/2004 | Yi et al. | |
| 2009/0026506 | A1 | 1/2009 | Matsumiya et al. | |

FOREIGN PATENT DOCUMENTS

| | | |
|---|---|---|
| JP | 05-013759 | 1/1993 |
| JP | 2004-320040 | 11/2004 |
| JP | 2005-303137 | 10/2005 |
| JP | 2007-048842 | 2/2007 |
| JP | 2008-078469 | 4/2008 |
| JP | 2009-032927 | 2/2009 |

* cited by examiner

*Primary Examiner* — Thao P Le
(74) *Attorney, Agent, or Firm* — Mori & Ward, LLP

(57) ABSTRACT

A field-effect transistor includes a plurality of unit elements which include a semiconductor layer having a first surface, a plurality of gate electrodes, drain electrodes, and source electrodes. Each of the plurality of gate electrodes is provided to define a drain electrode formation region which is surrounded by each of the plurality of gate electrodes. Each of the source electrodes is disposed in a source electrode formation region surrounded by the plurality of gate electrodes of the plurality of unit elements which are adjacent to each other. A source-gate distance between the each of the source electrodes and the each of the plurality of gate electrodes of the plurality of unit elements is shorter than a drain-gate distance between each of the drain electrodes and the each of the plurality of gate electrodes. The source electrode formation region is smaller than the drain electrode formation region.

11 Claims, 9 Drawing Sheets

FIELD-EFFECT TRANSISTOR

CROSS-REFERENCE TO RELATED APPLICATIONS

The present application claims priority under 35 U.S.C. §119 to Japanese Patent Application No. 2013-126101, filed on Jun. 14, 2013. The contents of this application are incorporated herein by reference in their entirety.

BACKGROUND OF THE INVENTION

1. Field of the Invention

The present invention relates to a field-effect transistor.

2. Description of the Related Art

A field-effect transistor includes a source electrode, a drain electrode and a gate electrode. The electrode structures with the source electrode, the drain electrode and the gate electrode is important factor to obtain a high maximum current and a low on resistance. As such an electrode structures, JP 2004-320040 A discloses an electrode structure having a finger-like shape (see FIG. 1 of JP 2004-320040 A) and an electrode structure in which gate electrodes are formed in a mesh-like shape (see FIG. 2B of JP 2004-320040 A). In addition, JP 2007-048842 A discloses an electrode structure in which drain electrodes are disposed in an island-like shape. As such a electrode structure, JP 2007-048842 A discloses an electrode structure in which gate electrodes are formed around respective drain electrodes having a quadrangle or hexagonal shape and source electrodes are formed across a plurality of elements in respective outside regions of the gate electrodes.

SUMMARY OF THE INVENTION

According to one aspect of the present invention, a field-effect transistor includes a plurality of unit elements. The plurality of unit elements include a semiconductor layer, a plurality of gate electrodes, drain electrodes, and source electrodes. The semiconductor layer has a first surface. The plurality of gate electrodes are provided on or above the first surface, respectively. Each of the plurality of gate electrodes is provided to define a drain electrode formation region which is surrounded by each of the plurality of gate electrodes. The drain electrodes, each of the drain electrodes is provided on the first surface in the drain electrode formation region. The source electrodes are provided on the first surface to be outside of the plurality of gate electrodes. Each of the plurality of unit elements includes the source electrodes. Each of the source electrodes is disposed in a source electrode formation region surrounded by the plurality of gate electrodes of the plurality of unit elements which are adjacent to each other. A source-gate distance between the each of the source electrodes and the each of the plurality of gate electrodes of the plurality of unit elements is shorter than a drain-gate distance between the each of the drain electrodes and the each of the plurality of gate electrodes. The source electrode formation region is smaller than the drain electrode formation region.

According to another aspect of the present invention, a field-effect transistor includes a plurality of unit elements. The plurality of unit elements include a semiconductor layer, a plurality of gate electrodes, drain electrodes, and source electrodes. The semiconductor layer has a first surface. The plurality of gate electrodes are provided on or above the first surface, respectively. Each of the plurality of gate electrodes is provided to define a drain electrode formation region which is surrounded by each of the plurality of gate electrodes. The drain electrodes, each of the drain electrodes is provided in a hexagonal shape on the first surface in the drain electrode formation regions. The source electrodes are provided in a triangle shape or a quadrangle shape on the first surface to be outside of the plurality of gate electrodes. Each of the plurality of unit elements includes the source electrodes. Each of the source electrodes is disposed in a source electrode formation region surrounded by the plurality of gate electrodes of the plurality of unit elements which are adjacent to each other. A source-gate distance between the each of the source electrodes and the each of the plurality of gate electrodes of the plurality of unit elements is shorter than a drain-gate distance between the each of the drain electrodes and the each of the plurality of gate electrodes. The source electrode formation region is smaller than the drain electrode formation region.

According to further aspect of the present invention, a field-effect transistor includes a plurality of unit elements. The plurality of unit elements include a semiconductor layer, a plurality of gate electrodes, drain electrodes, and source electrodes. The semiconductor layer has a first surface. The plurality of gate electrodes are provided on or above the first surface, respectively. Each of the plurality of gate electrodes is provided to define a drain electrode formation region which is surrounded by each of the plurality of gate electrodes. The drain electrodes, each of the drain electrodes is provided in a round shape on the first surface in the drain electrode formation region. The source electrodes are provided in a deformed triangle shape or a deformed quadrangle shape in which sides are dented in an arc shape on the first surface to be outside of the plurality of gate electrodes. Each of the plurality of unit elements includes the source electrodes. Each of the source electrodes is disposed in a source electrode formation region surrounded by the plurality of gate electrodes of the plurality of unit elements which are adjacent to each other. A source-gate distance between the each of the source electrodes and the each of the plurality of gate electrodes of the plurality of unit elements is shorter than a drain-gate distance between the each of the drain electrodes and the each of the plurality of gate electrodes. The source electrode formation region is smaller than the drain electrode formation region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
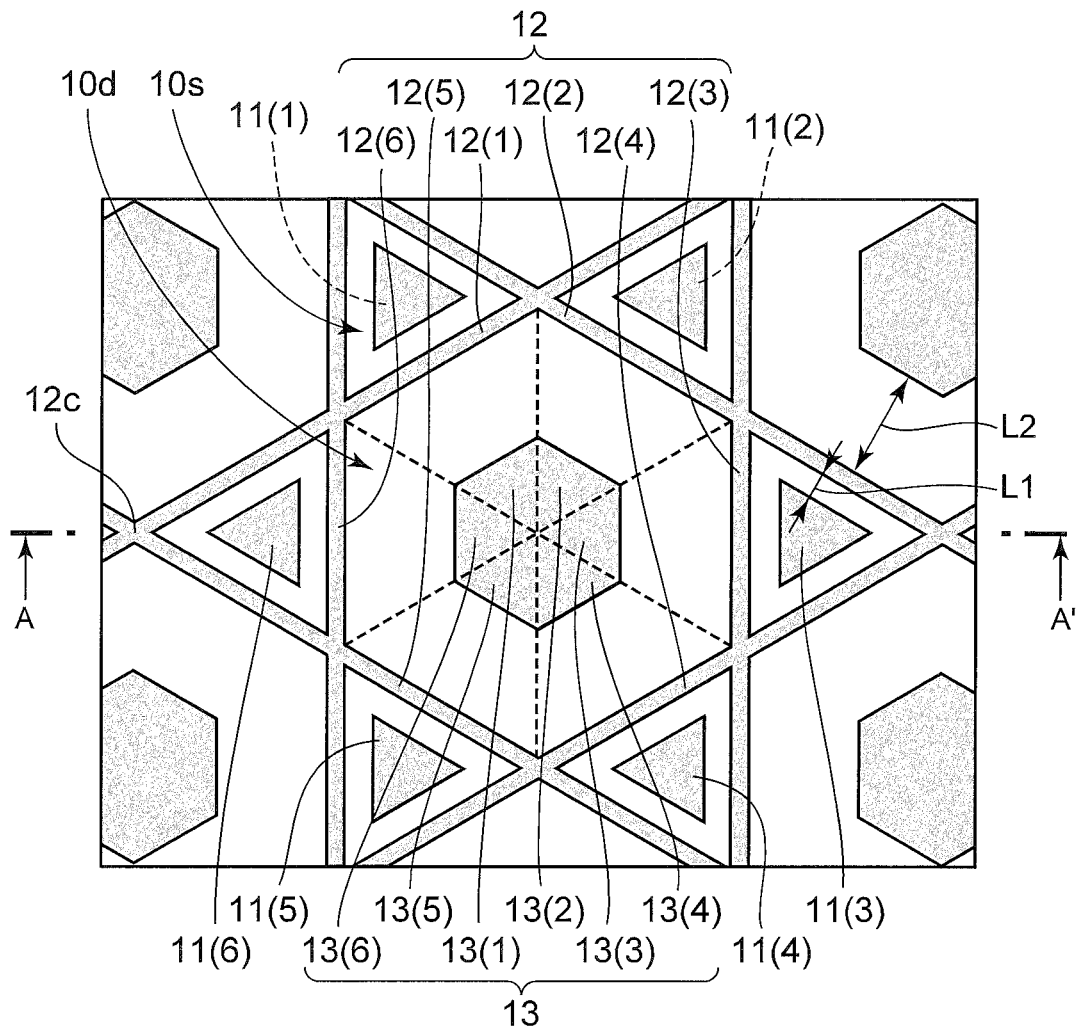
FIG. 1A is a plan view showing an electrode structure of a field-effect transistor according to embodiment 1.

The embodiments will now be described with reference to the accompanying drawings, wherein like reference numerals designate corresponding or identical elements throughout the various drawings.

A field-effect transistor according to the present embodiment will be described below with reference to the accompanying drawings.

Electrode structures of the embodiments are applied to field-effect transistors, thereby providing a field-effect transistor having the high maximum current and the low on resistance.

Electrode structures of embodiments will be described below.

Embodiment 1

Figure 1B:
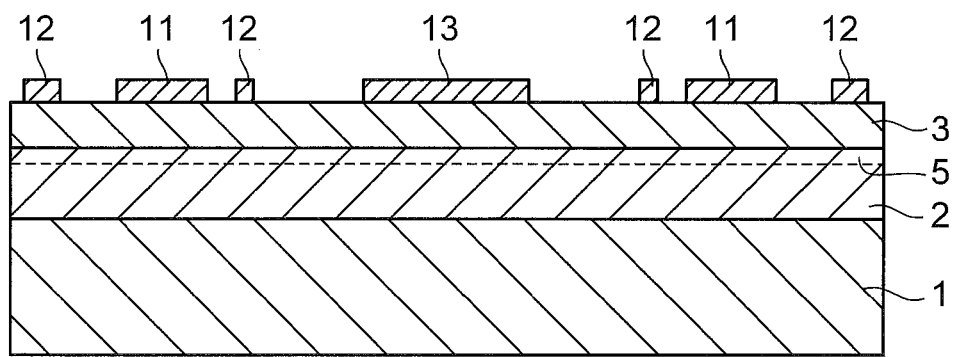
FIG. 1B is a cross-sectional view of a field-effect transistor of the embodiment 1 showing a cross-section taken along the line A-A' of FIG. 1A.

FIG. 1A is a plan view showing an electrode structure of a field-effect transistor according to the embodiment 1. FIG. 1B is a cross-sectional view of the field-effect transistor of the embodiment 1 showing a cross-section taken along the line A-A' of FIG. 1A. The field-effect transistor of the embodiment 1 shows an example in which an electrode structure according to the embodiment 1 is applied to a GaN-based HEMT. The field-effect transistor of the embodiment 1, makes it possible to provide a GaN-based HEMT having the high maximum current and the low resistance. This GaN-based HEMT includes, for example, substrate 1, undoped GaN layer 2 formed on or above the substrate 1 and undoped AlGaN layer 3 formed on or above the undoped GaN layer 2, and an electrode structure according to the embodiment 1 is formed on the surface of the undoped AlGaN layer. In the GaN-based HEMT, two-dimensional electron gas layer 5 (channel) formed near the interface of the undoped GaN layer and the undoped AlGaN layer is utilized. In this GaN-based HEMT, the semiconductor layers are grown so that the surface of the semiconductor layer in which electrodes are formed (in the above-mentioned example, the surface of undoped AlGaN layer) to be the (0001) face (also referred to as the +C face).

The field-effect transistor of the embodiment 1 includes a plurality of unit elements, each including drain electrode 13, gate electrode 12 formed around the drain electrode 13 and parts of source electrodes 11 formed outside of the gate electrode 12. In the field-effect transistor of the embodiment 1, the drain electrodes 13, the gate electrodes 12 and the source electrodes 11 are formed on one surface (the first surface) of a semiconductor layer. At the first surface of the semiconductor layer, the drain electrode 13 and the gate electrode 12 are respectively provided for each unit element. The source electrodes 11 are provided outside of the gate electrode 12 of each unit element to be shared by more than one unit element, and serves as a source electrode in each unit element. The phrase "at the first surface of the semiconductor layer, the drain electrodes 13 and the gate electrodes 12 are provided for each unit element" as used herein means that it is possible to determine and recognize which unit element the drain electrode 13 and the gate electrode 12 belong to in terms of function to serve as the drain electrode and the gate electrode. The gate electrodes 12 and the drain electrodes 13 belonging to respective different unit elements may be electrically connected at the first surface or at a surface of an insulating layer formed on the first surface, for example, via a through-hole provided on a semiconductor layer. That is, in the embodiment 1, the drain electrodes 13 having a hexagonal shape are independently disposed on the first surface so that each of the drain electrodes 13 is independent from each other, and respectively serve as a drain electrode in each unit element. However, for example, the drain electrodes 13 may be electrically connected on another place other than the first surface. In addition, while the gate electrodes 12 are connected to each other on the first surface via the gate electrode connecting part 12c, each of the gate electrodes 12 having a ring-like shape except for the gate electrode connecting part 12c serves as a gate electrode in each unit element. The respective gate electrodes 12 having a ring-like shape are not shared by more than one unit element.

In contrast, the source electrodes 11 are formed in regions surrounded by the gate electrodes 12 of more than one (three) adjacent unit element, and each of the source electrodes 11 serves as a common source electrode for more than one unit element (three unit elements).

The field-effect transistor of the embodiment 1 will be described in detail below.

The field-effect transistor of the embodiment 1 is composed of a plurality of unit elements which are arranged so that the centers of respective unit elements coincide with grid points of an equilateral-triangle grid. In addition, each of the unit elements has the drain electrode 13 having a hexagonal shape center of which coincides with the grid point, the gate electrodes 12 which are formed in a hexagonal ring-like shape and disposed at a predetermined distance L2 from the circumference of the drain electrode 13, and the source electrodes 11 which are separated from each other so as to be disposed at a predetermined distance L1 from the gate electrode 12 in regions outside of the respective gate electrodes 12. In the field-effect transistor of the embodiment 1, it may be understood that the unit element is further composed of the six component transistors as follows.

That is, a component transistor includes one drain electrode 13 ($n$) corresponding to one of six regions that the drain electrode 13 having a hexagonal shape virtually divided into, the gate electrode 12($n$) corresponding to one side of the gate electrode 12 having a hexagonal ring-like shape and one source electrode 11($n$). The six component transistors collect to form the unit element. "n" as used herein is an integer of 1 to 6. In the specification, when a source electrode and a gate electrode are specified by the site, a source electrode and a gate electrode are described as the source electrode 11($n$) and the gate electrode 12($n$), respectively. When a source electrode and a gate electrode are not specified by the site, a source electrode and a gate electrode are simply described as a source electrode 11 and a gate electrode 12, respectively.

The drain electrode 13(*n*) as used herein is defined as an equilateral-triangle region which has a base corresponding to a side of a hexagonal of the drain electrode 13 and a top corresponding to the center of a hexagonal of the drain electrode 13, and the region has one sixth area of the area of the drain electrode 13. In the embodiment 1, a side of the drain electrode 13 having a hexagonal shape, i.e., the base of the drain electrode 13(*n*) is set to the same degree of the length of a side of the source electrode 11(*n*) (a side faced with the base of the drain electrode 13(*n*)). In addition, the source electrode 11(*n*) is disposed in a region having an equilateral-triangle shape (the source electrode formation region 10*s*) surrounded by the gate electrodes 12(*n*) of three unit elements which correspond to three adjacent triangle grid points, respectively, at the same distance from the respective gate electrodes 12(*n*) in an equilateral-triangle shape. The source electrode is shared with the three unit elements and serves as a source electrode in each of the three unit elements.

Figure 1C:
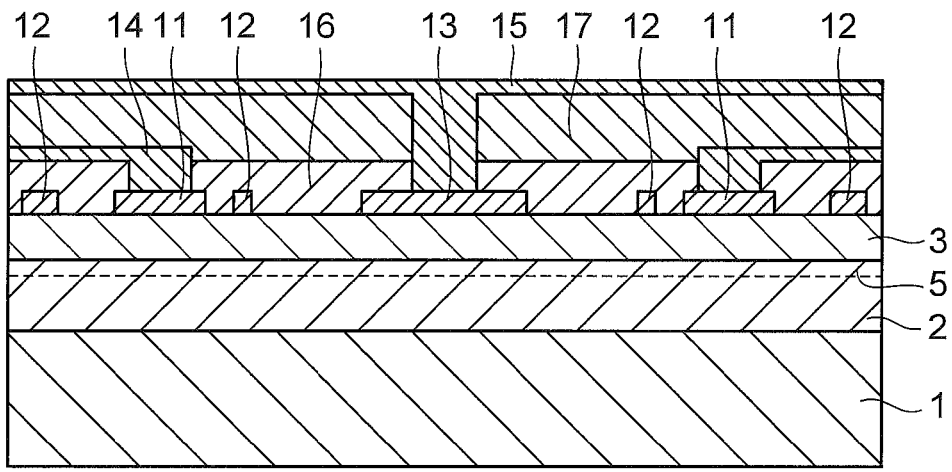
FIG. 1C is a cross-sectional view of a field-effect transistor of the embodiment 1 showing a structure in which source electrodes and drain electrodes are connected to the other source electrodes and the other drain electrodes, respectively, across a plurality of elements.

The gate electrodes 12 of adjacent unit elements are connected to each other on the first surface. In contrast, as shown in FIG. 1C, the source electrodes 11 are connected to each other on the first insulating film 16 formed on the first surface across a plurality of unit elements. More specifically, the first insulating film 16 covering the source electrodes 11, the gate electrodes 12 and the drain electrodes 13 is formed. Then, through-holes are formed in the first insulating film 16 on the respective source electrodes 11. For example, the through-holes are filled with conductive materials, and the conductive materials are connected each other on the first insulating film 16. In FIG. 1C, the conductive materials in the through-halls and a conductor which connects to the conductive materials on the first insulating film are shown as a source connecting conductor with symbol 14. The drain electrodes 13 are connected to each other on the second insulating film 17 formed on the first insulating film 16 across a plurality of unit elements. More specifically, through-holes which penetrate both of the first insulating film 16 and the second insulating film 17 on the respective drain electrodes 13 are formed, and for example, the through-holes are filled with conductive materials. The conductive materials are connected each other on the second insulating film 17. In FIG. 1C, conductive materials in the through-halls and a conductor which connects to the conductive materials on the second insulating film are shown as a drain connecting conductor with symbol 15.

In the electrode structure of the embodiment 1 formed in the above-mentioned manner, in consideration of the condition that the source-gate distance L1 is shorter than the drain-gate distance L2, (a) a source electrode which is disposed so as to correspond to one unit element is separated into a plurality of source electrodes, and (b) an area of a region surrounded by the gate electrodes 12 of adjacent unit elements where the separated source electrode 11(*n*) is formed (referred to as the source electrode formation region 10*s*) is set to be smaller than region surrounded by the gate electrode 12 where the drain electrode 13 is formed (hereinafter referred to as the drain electrode formation region 10*d*).

More specifically, in the embodiment 1, (a) a source electrode which is disposed so as to correspond to one unit element is separated into six source electrodes, and (b) an area of the source electrode formation region 10*s* surrounded by the gate electrodes 12 (*n*) of three adjacent unit elements where the separated source electrode 11(*n*) is formed is set to be smaller than the drain electrode formation region 10*d* surrounded by the gate electrode 12 having a hexagonal ring-like shape where the drain electrode 13 is formed, which reduces an area in the first surface occupied by the source electrodes 11, providing an electrode structure which makes it possible to form more unit elements. More specifically, an area of the source electrode formation region 10*s* having a equilateral-triangle shape is one sixth of the drain electrode formation region 10*d* surrounded by the gate electrode 12 having a hexagonal ring-like shape which the drain electrode 13 is formed in.

By the structure which is formed in the above-mentioned manner so that the source-gate distance L1 is shorter than the drain-gate distance L2, the number of the unit elements formed per unit area may increase while ensuring a size of the drain electrode 13 not less than required level. Thus, the total length of the gate electrode 12 may be lengthened and the total channel width may increase. In this way, in the electrode structure of the present embodiment 1, the total length of the gate electrode 12 may be lengthened while ensuring a size of the drain electrode 13 not less than required level. Thus, a high maximum current and a low on resistance may be obtained as a whole. In addition, while the channel width per unit element may be obtained in a certain level or more, the number of the unit elements per unit area may increase. Thus, since the channel width can increase, the high density device can be produced.

The reason will be described below. When the source-gate distance and the drain-gate distance are the same, for example, the gate electrodes 102 are formed in a grid shape and the source electrodes and the drain electrodes are alternately formed in a square shape with an equivalent size on the respective regions which are the same in area and partitioned with the gate electrodes 102. This makes it possible to increase the number of unit elements per unit area by minimizing the electrode area required for the both of the source electrodes and the drain electrodes. In this case, the number of unit elements may increase to the same degree of the electrode structure in the present embodiment 1.

However, in order to obtain a high breakdown voltage, the drain-gate distance has to be longer than the source-gate distance. In particular, a GaN-based field-effect transistor composed of a nitride semiconductor such as GaN, AlGaN and AlN tends to be required for a high breakdown voltage in a structure in which all electrodes are formed on one surface unlike a Si in which electrodes are formed on the both surface, a GaAs having a low breakdown voltage or the like. Thus, the long drain-gate distance is preferred. For example, the distance between the gate electrode and the drain electrode is preferably 1 to 50 μm, more preferably 5 to 20 μm. In this case, however, in the electrode structure in which the gate electrodes 102 are formed in a grid shape and source electrodes and drain electrodes are alternately formed on the respective regions which are the same in area and partitioned with the gate electrodes 102 as shown in FIG. 13, the following problems occur.

Figure 13:
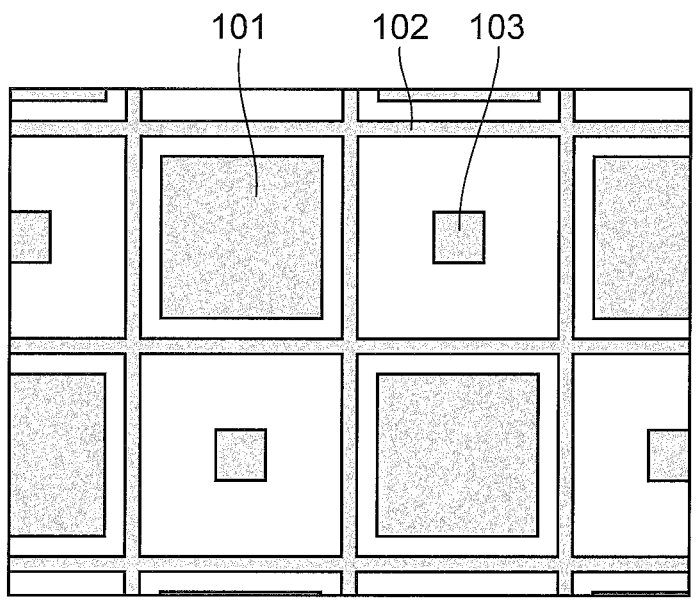
FIG. 13 is a plan view showing an electrode structure of a field-effect transistor of reference example 1.
Figure 14:
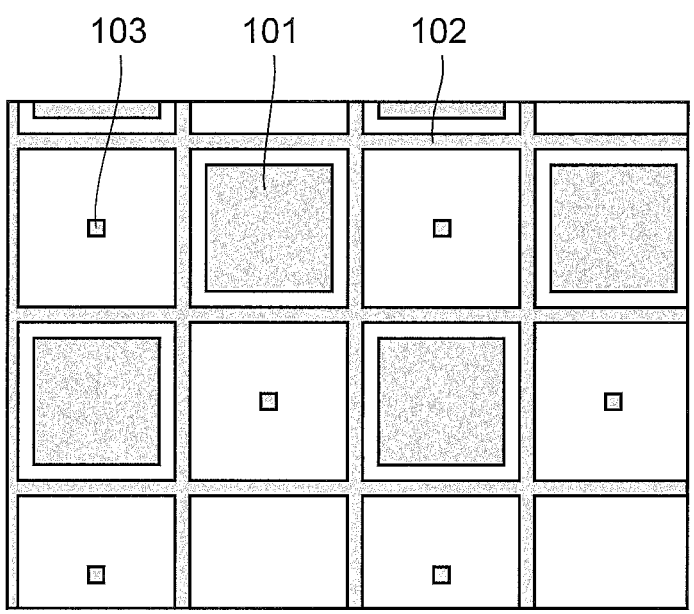
FIG. 14 is a plan view showing an electrode structure of a field-effect transistor of reference example 2.

Firstly, as shown in FIG. 13 and FIG. 14, when the drain-gate distance is longer than the source-gate distance, the source electrodes 101 relatively become larger and the proportion of the total area of the source electrodes 101 to the area of the entire device increases, limiting the number of unit elements per unit area. As a result, the total channel width cannot increase.

Furthermore, when the number of unit elements per unit area increases, the size of the drain electrodes 103 becomes smaller. In this case, the number of unit elements per unit area is limited in order to obtain an area required for the drain electrode 103. That is, reducing the size of the grid of the gate electrode 12 is limited in order to obtain an area required for the drain electrode 103, and thus, the total length of the gate electrode 12 may not become sufficiently longer. For example, as shown in FIG. 14, when the drain electrodes 103 is too small, there are problems such as the fact that the connecting and the power feeding between the drain electrodes 103 are difficult and that the contact resistance of the drain electrodes 103 becomes higher.

Thus, in the electrode structure shown in FIG. 13, increasing the total channel width is limited, which makes it difficult to obtain a high maximum current and a low on resistance.

In contrast, in the present embodiment 1, in consideration of the condition that the source-gate distance L1 is shorter than the drain-gate distance L2,
(a) the source electrode 11 which is disposed so as to correspond to one unit element is separated into the six source electrodes 11($n$), and
(b) an area of the source electrode formation region 10$s$ where the source electrode 11($n$) is formed is set to be smaller than the drain electrode formation region 10$d$ where the drain electrode 13 is formed. As a result, the size of the source electrode 11 and the area of the source electrode formation region are prevented from relatively increasing.

For example, in the electrode structure of the embodiment 1, while the ratio of the source-gate distance L1 and the drain-gate distance L2 is set to the same degree of the electrode structure in FIG. 13, the area of the drain electrode 13 in one unit element and the total source electrode area of the source electrodes 11(1)-11(6) in one unit element are the same.

In contrast, in the electrode structure shown in FIG. 13, the area of the source electrode 101 is clearly larger than the area of the drain electrode 103.

In the present embodiment 1, in consideration of the condition that the source-gate distance L1 is shorter than the drain-gate distance L2,
(a) the source electrode 11 which is disposed so as to correspond to one unit element is separated into the six source electrodes 11($n$), and (b) an area of the source electrode formation region 10$s$ where the source electrode 11($n$) is formed is smaller than that of the drain electrode formation region 10$d$ where the drain electrode 13 is formed, and the drain electrode 13 is larger than the source electrode 11($n$). As a result, the drain-gate distance L2 may be longer than the source-gate distance L1, and a device having a higher breakdown voltage may be provided.

Thus, by applying the electrode structure of the present embodiment 1 to a field-effect transistor, a field-effect transistor having a high maximum current and a low on resistance may be provided.

Embodiment 2

Figure 2:
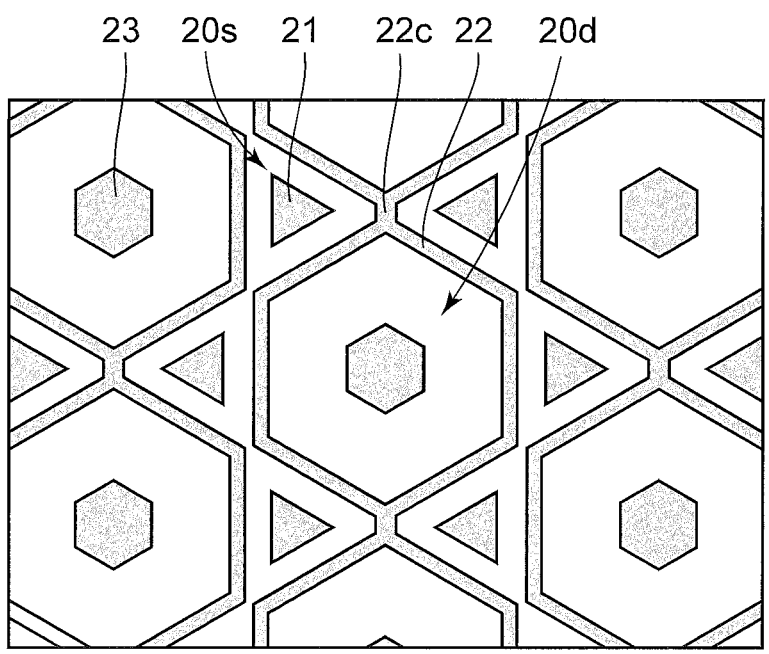
FIG. 2 is a plan view showing an electrode structure of a field-effect transistor according to the embodiment 2.

FIG. 2 is a plan view showing the electrode structure of the field-effect transistor of the embodiment 2.

The field-effect transistor of the embodiment 2 differs from the one of the embodiment 1 in the following points: a side of the drain electrode 23 is smaller than a side of the source electrode 21; and the gate electrodes 22 between unit elements arranged in one direction are connected to each other via the gate electrode connecting part 22$c$ and the gate electrodes 22 are disposed so as to be separated from each other between the other adjacent unit elements. The field-effect transistor of the embodiment 2 is the same as the one of the embodiment 1 in the following points: the source-gate distance is shorter than the drain-gate distance; and the area of the source electrode formation region 20$s$ is smaller than that of the drain electrode formation region 20$d$.

As mentioned above, in the electrode structure of the field-effect transistor of the embodiment 2, the gate electrodes 22 between unit elements arranged in one direction are connected to each other via the gate electrode connecting part 22$c$ having the predetermined length, and the gate electrodes 22 are disposed so as to be separated from each other between the other adjacent unit elements. Thus, while the area of the source electrode formation region 20$s$ may be the same degree of that of the source electrode formation region 10$s$ in the embodiment 1, the area of the drain electrode formation region 20$d$ may be smaller than that of the drain electrode formation region 10$d$ of the embodiment 1.

In the field-effect transistor of the embodiment 2 formed in the above-mentioned manner, the source-gate drain distance is smaller than the drain-gate distance, and the area of the source electrode formation region 20$s$ is smaller than that of the drain electrode formation region 20$d$. As a result, the field-effect transistor of the embodiment 2 has the same effect as that achieved by the field-effect transistor of the embodiment 1.

In addition, in the field-effect transistor of the embodiment 2, a side of the drain electrode 23 is smaller than that of the source electrode 21. Thus, unit elements may be formed with a high density, and the channel width may increase as a whole.

Furthermore, as shown in FIG. 1A to FIG. 4, when the drain electrode 23 and the source electrode 21 have a polygonal shape in planar view and the number of corners in the shape of the drain electrode 23 is more than that of the source gate electrode 21, the area of the drain electrode 23 does not become too small even if a side of the drain electrode 23 is smaller than that of the source electrode 21. Accordingly, there is no problem which occurs by the reduction of the area of the drain electrode as described above such as the fact that the connecting and the power feeding become difficult between the drain electrodes and the contact resistance of the drain electrodes becomes higher. For example, a side of the drain electrode 23 having a hexagonal shape may reduce to about a half a side of the source electrode 21 having a triangle shape.

In the present embodiment, when a side of the source electrode 21 is, for example, 8 μm, a side of the drain electrode 23 may be about 4 μm.

Embodiment 3

Figure 3:
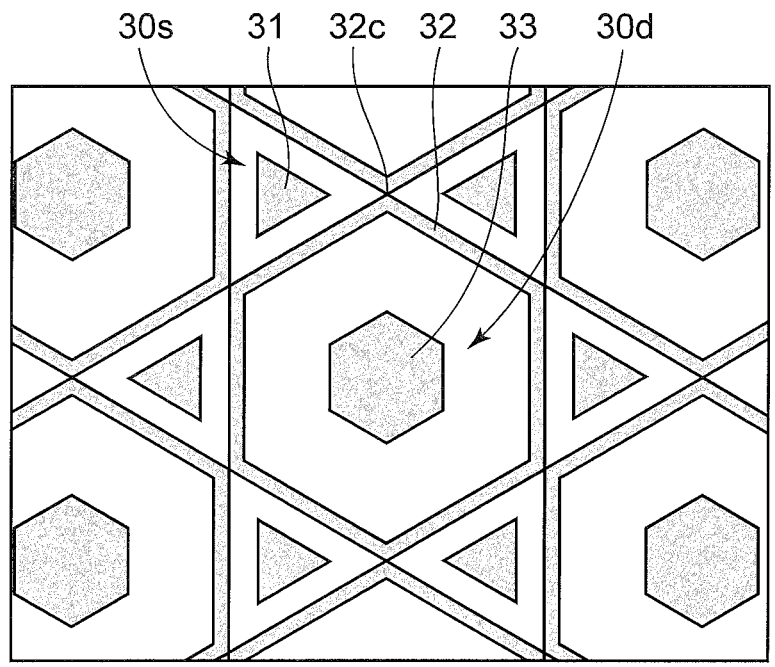
FIG. 3 is a plan view showing an electrode structure of a field-effect transistor according to the embodiment 3.

FIG. 3 is a plan view showing the electrode structure of the field-effect transistor of the embodiment 3.

The field-effect transistor of the embodiment 3 differs from the one of the embodiment 1 in the following points: a side of the drain electrode 33 is smaller than that of the source electrode 31; and the gate electrodes 32 between unit elements are connected to each other with the gate electrode connecting part 32$c$ so as to contact each other. The field-effect transistor of the embodiment 3 is the same as the one of the embodiment 1 in the following points: the source-gate distance is shorter than the drain-gate distance; and the area of the source electrode formation region 30$s$ is smaller than that of the drain electrode formation region 30$d$.

As mentioned above, in the electrode structure of the field-effect transistor of the embodiment 3, the gate electrodes 32 between unit elements are connected to each other with the gate electrode connecting part 32$c$ so as to contact each other. Thus, while the area of the source electrode formation region 30$s$ is the same degree of that of the source electrode formation region 10$s$ in the embodiment 1, the area of the drain electrode formation region 30$d$ may be smaller than that of the drain electrode formation region 10$d$ of the embodiment 1.

In the field-effect transistor of the embodiment 3 formed in the above-mentioned manner, the source-gate distance is shorter than the drain-gate distance, and the area of the source electrode formation region 30s is smaller than that of the drain electrode formation region 30d. Thus, the field-effect transistor of the embodiment 3 has the same effect as that achieved by the field-effect transistor of the embodiment 1.

In addition, in the field-effect transistor of the embodiment 3, a side of the drain electrode 33 is smaller than that of the source electrode 31. Thus, unit elements may be formed with a high density, and the channel width may increase as a whole.

In the present embodiment, when a side of the source electrode 31 is, for example, 8 μm, a side of the drain electrode 33 may be about 6 μm.

Embodiment 4

Figure 4:
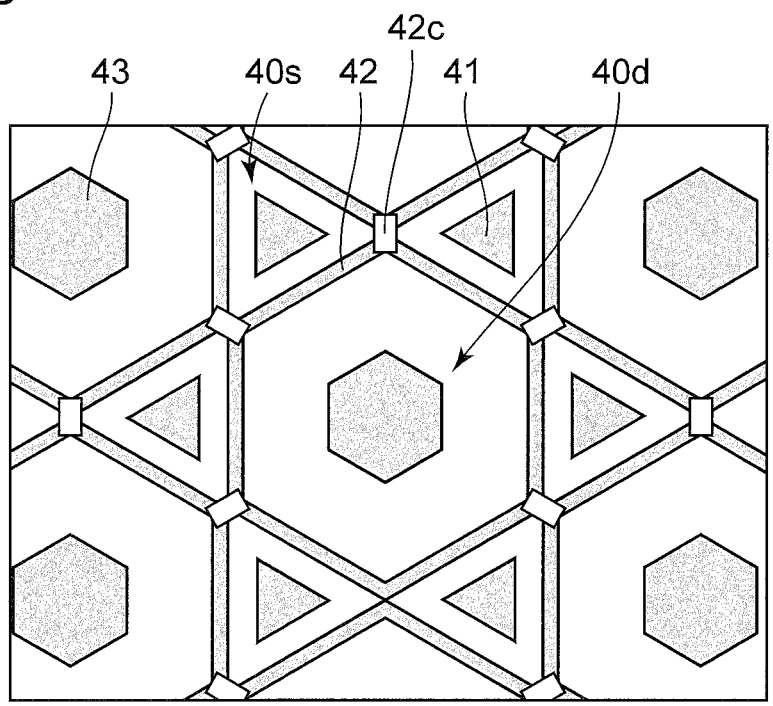
FIG. 4 is a plan view showing an electrode structure of a field-effect transistor according to the embodiment 4.

FIG. 4 is a plan view showing the electrode structure of the field-effect transistor of the embodiment 4.

The field-effect transistor of the embodiment 4 differs from the one of the embodiment 2 in the following point: the gate electrodes 42 are sterically connected to each other with the gate electrode connecting part 42c having a predetermined length as substitute for the gate electrode connecting part 22c in the embodiment 2. The field-effect transistor of the embodiment 4 has the same point as that of the embodiment 2 as follows: the source-gate distance is shorter than the drain-gate distance; and the area of the source electrode formation region 40s is smaller than that of the drain electrode formation region 40d. In addition, the phrase "sterically connected to each other with the gate electrode connecting part 42c" means that the gate electrodes which are separated from each other on the first surface of a semiconductor are connected to each other, for example, on the surface such as the surface of the first insulating film which is different from the first surface.

As mentioned above, in the electrode structure of the field-effect transistor of the embodiment 4, the gate electrodes 42 are sterically connected to each other with the gate electrode connecting parts 42c having a predetermined length. Thus, while the area of the source electrode formation region 30s is the same degree of that of the source electrode formation region 10s in the embodiment 1, the area of the drain electrode formation region 40d may be smaller than that of the drain electrode formation region 10d of the embodiment 1.

In the field-effect transistor of the embodiment 4 formed in the above-mentioned manner, the source-gate distance is shorter than the drain-gate distance, and the area of the source electrode formation region 40s is smaller than that of the drain electrode formation region 40d.

Thus, the field-effect transistor of the embodiment 4 has the same effect as that achieved by the field-effect transistor of the embodiment 1. In the field-effect transistor of the embodiment 4, a side of the drain electrode 43 is shorter than that of the source electrode 41. Thus, unit elements may be formed with a high density, and the channel width may increase as a whole.

In the present embodiment, when a side of the source electrode 41 is, for example, 8 μm, a side of the drain electrode 43 may be about 4 μm.

In the embodiments (embodiments 1-4), a gate length of the gate electrode can be set, for example, in the range of 0.01 μm to 10 μm, preferably, in the range of 0.5 μm to 5 μm. In addition, the width of the drain electrode can be set, for example, in the range of 0.5 μm to 30 μm, preferably, in the range of 1 μm to 10 μm. As used in the specification, the term "width of the drain electrode" means the diameter in the case of the drain electrode having a circle shape or the width in the widest part in the case of the drain electrode having a polygonal shape.

When the drain electrode has a regular polygonal shape, the length of the side can be set, for example, in the range of 0.1 μm to 30 μm, preferably, in the range of 1 μm to 10 μm.

When the source electrode and drain electrode have a polygonal shape, the length of the side of the source electrode faced with the drain electrode can be set, for example, in the range of 0.1 times to 50 times a side of the drain electrode, preferably, in the range of 0.5 times to 10 times a side of the drain electrode. The values described above are merely examples. Thus, the source electrode, the drain electrode and the gate electrode may be optionally adjusted for the length so as to obtain a low on resistance and a high maximum current.

The field-effect transistors of the above-mentioned embodiments 1-4 are shown with examples in which the gate electrodes 12, 22, 32, 42 have a hexagonal ring shape, the drain electrodes 13, 23, 33, 43 have a hexagonal shape and the source electrodes 11, 21, 31, 41 have a triangle shape.

Figure 5:
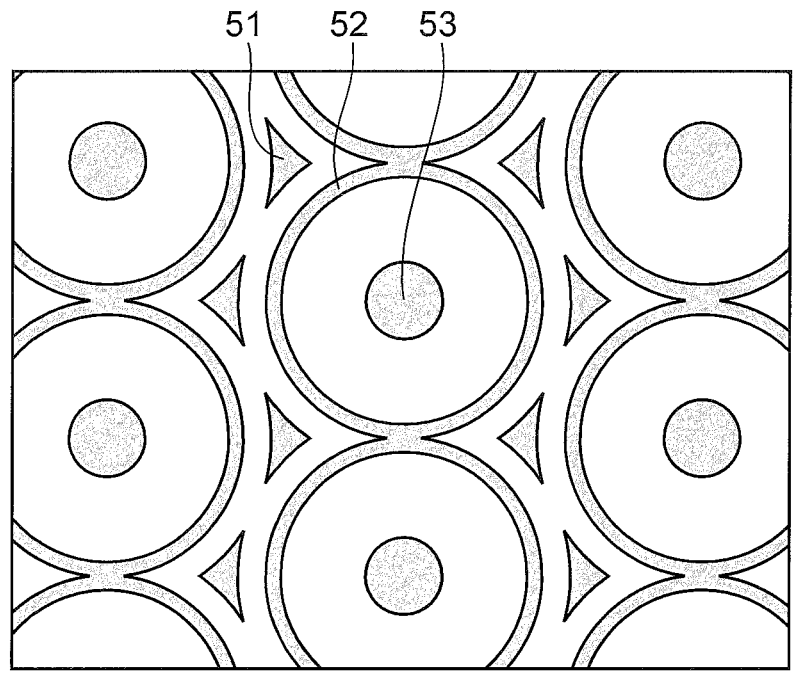
FIG. 5 is a plan view showing an electrode structure of a field-effect transistor of variant example 1.

However, the present invention is not limited to the electrode shapes illustrated in the embodiments. For example, as shown in FIG. 5, the gate electrode 52 having a ring-like shape may be a circle shape, the drain electrodes 53 may be a circle shape and the source electrodes 51 may be a deformed triangle.

The term "deformed triangle" as used herein means a triangle in which 1, 2 or 3 sides are dented in the arc-like form when the shapes of the gate electrode and the like are circle. In the embodiment of the present invention, for example, the gate electrode having a ring-like shape may have an n-gonal shape (n is an integer of 5 or more) and the drain electrode may have an n-gonal shape (n is an integer of 5 or more). In this case, the drain electrode may have an optional shape.

In the embodiment of the present invention, the shape in the planar view or the arrangement of the source electrodes, the drain electrodes and the gate electrodes which compose unit elements has preferably rotation symmetry around the center of the drain electrode. For example, in the field-effect transistor of the embodiment 1 (FIG. 1A), each of the six component transistors having the same shape is arranged by the rotation around the center of the drain electrode by 60 degrees, and the shape in the planar view or the arrangement of the source electrodes, the drain electrodes and the gate electrodes has six-fold rotation symmetry around the center of the drain electrode. Accordingly, the shape in the planar view or the arrangement of the source electrodes, the drain electrodes and the gate electrodes has six-fold rotation symmetry around the center of a drain electrode and corresponds to the shape or the arrangement of each group in the rotations by 60, 120, 180, 240, 300 and 360 degrees.

In the field-effect transistors of the above-mentioned embodiments 1-4, unit elements are arranged so that each center of the unit elements corresponds to a grid point of a triangle grid. As a result, the unit elements may be disposed in a high density.

However, the embodiment of the present invention is not limited to such a field-effect transistor. For example, unit elements may be arranged so that each center of the unit elements corresponds to a grid point of a quadrangle grid. Furthermore, unit elements may be arranged so that each center of the unit elements corresponds to a grid point of a square grid.

Figure 6:
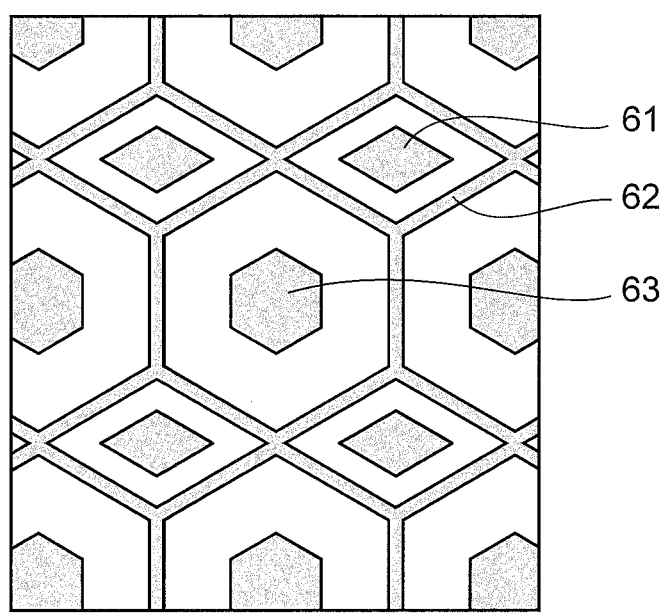
FIG. 6 is a plan view showing an electrode structure of a field-effect transistor of variant example 2.
Figure 7:
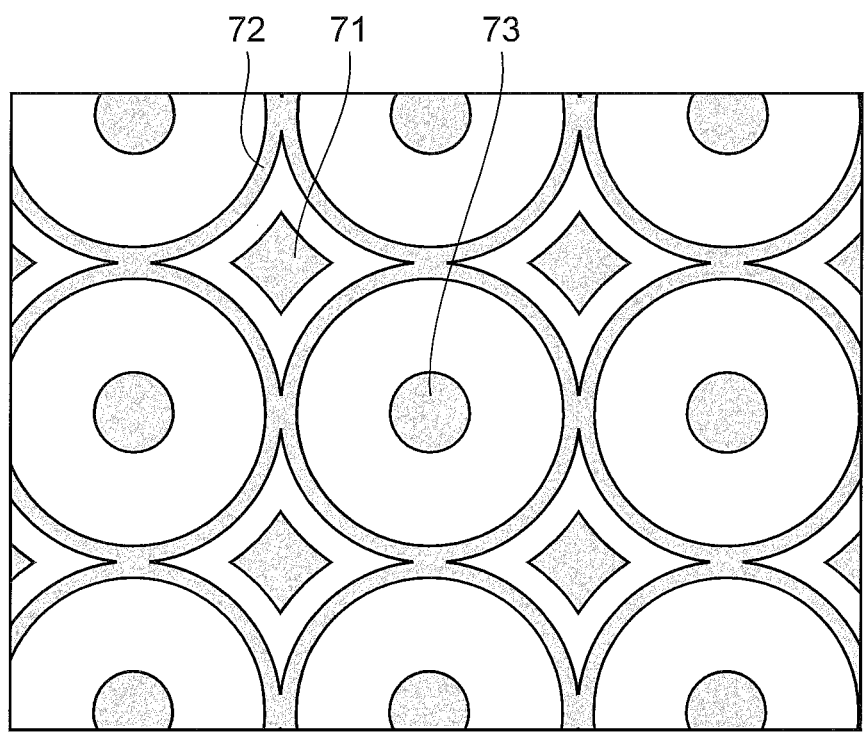
FIG. 7 is a plan view showing an electrode structure of a field-effect transistor of variant example 3.

In a field-effect transistor in which unit elements are arranged so that each center of the unit elements corresponds to a grid point of a square grid, a source electrode 61 can have a quadrangle shape (e.g., a diamond shape) when a ring-like gate electrode 62 has a hexagonal shape and a drain electrode 63 has a hexagonal shape as shown in FIG. 6. In addition, when a ring-like gate electrode 72 has a circle shape and a drain electrode 73 has a circle shape as shown in FIG. 7, the source electrode 71 can have a deformed quadrangle shape having four sides which are dented in the arc-like form.

EXAMPLES

As Example 1, a field-effect transistor having an electrode structure of the embodiment 2 shown in FIG. 2 is produced. The field-effect transistor in Example 1 was a GaN-based HEMT, and a sapphire substrate is used as the substrate 1. Above the substrate 1, an undoped GaN layer having a thickness of 0.5 µm, an AlN layer having a thickness of 0.9 nm and an undoped AlGaN layer having a thickness of 7 nm are laminated in this order, and then, gate electrodes, drain electrodes and source electrodes described in detail bellow are formed to produce the field-effect transistor.

In Example 1, a grid point distance of a triangle grid which specifies the arrangement of unit elements is about 27 µm. A side of the drain electrode 23 having a hexagonal shape is 3.9 µm, a side of a gate electrode 22 having a hexagonal ring-like shape (shown herein as an internal length faced with the drain electrode 23) is about 12 µm and a side of the source electrode 21 having a triangle shape is 8 µm.

Figure 9:
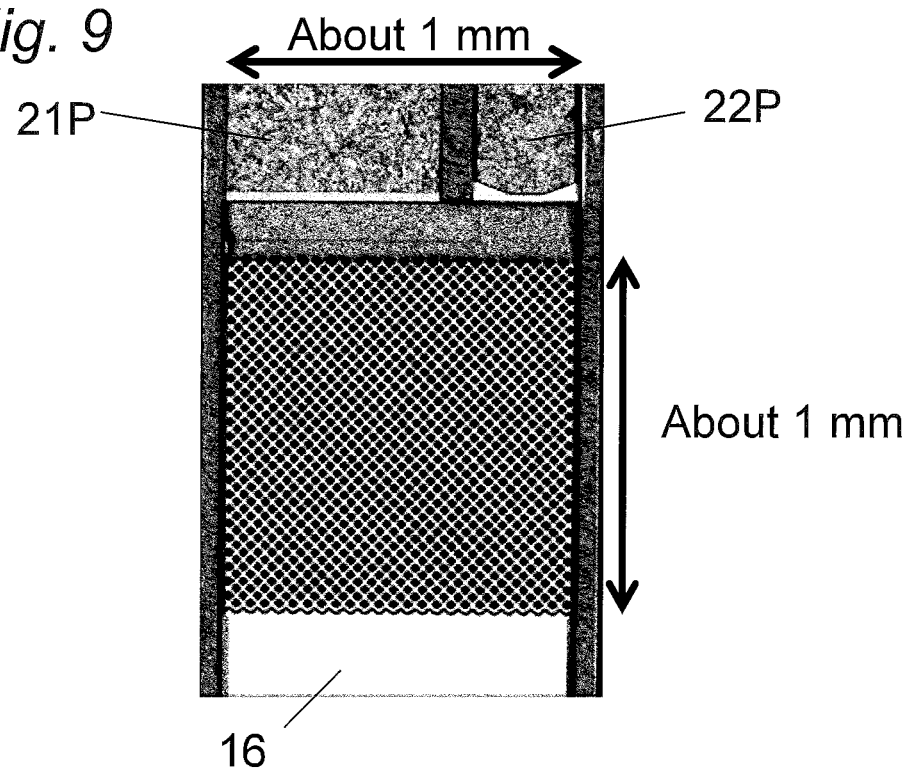
FIG. 9 is a drawing substitute photograph showing an electrode structure of a field-effect transistor of Example 1.

The respective distances between electrodes are as follows:
Source electrode-gate electrode distance: 2 µm
Gate length (the width of the gate electrode): 1 µm
Gate electrode-drain electrode distance: 7 µm In this way, as shown in FIG. 9, the field-effect transistor of Example 1 including 1613 unit elements (herein, one drain electrode and their periphery compose one unit element) in the range of 1 mm squares on the first surface of a semiconductor layer are formed.

Between the unit elements, the drain electrodes are connected to each other via an insulating film by the use of Au plating. The source electrodes are also connected to each other via an insulating film by the use of Au plating. In FIG. 9, 21P is a source pad electrode, 22P is a gate pad electrode and 23P is a drain pad electrode.

Figure 10:
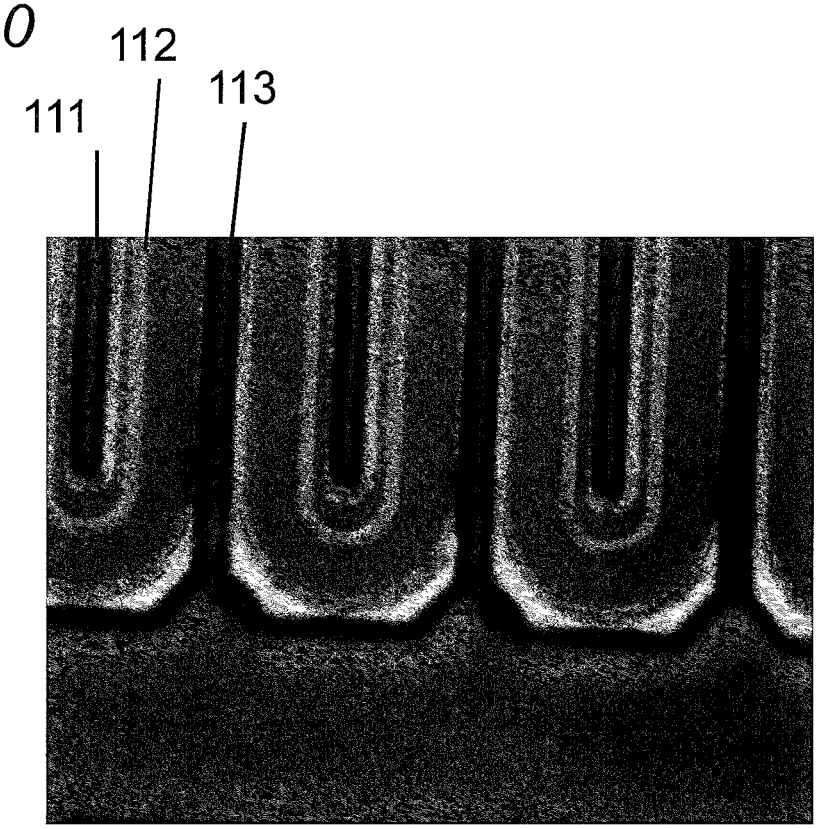
FIG. 10 is a drawing substitute photograph showing an electrode structure of a field-effect transistor of comparative example 1.

As comparative example 1, a field-effect transistor in which an electrode structure of the conventional example (comb-like structure) shown in FIG. 10 is formed in the range of 1 mm squares on the first surface of a semiconductor layer is produced.

A source electrode 111, a drain electrode 113 and a gate electrode 112 of comparative example 1 have a comb-like structure so that the interval (distance) between the respective electrodes and the gate length were the same as those of Example 1. The gate electrode has 66 fingers of 1 mm in length, the source gate electrode 111 has 34 fingers of 1 mm in length, and the drain gate electrode 113 has 33 fingers of 1 mm in length. The field-effect transistor of comparative example 1 competes on the number and the length of the fingers in the source electrode 111 and the number and the length of the fingers in the drain electrode 113 so that a low on resistance and a high maximum current are optimized in the same distances between the gate electrode 112 and the source electrode 111 or the drain electrode 113 as those of Example and the same gate length as that of Example.

Figure 11:
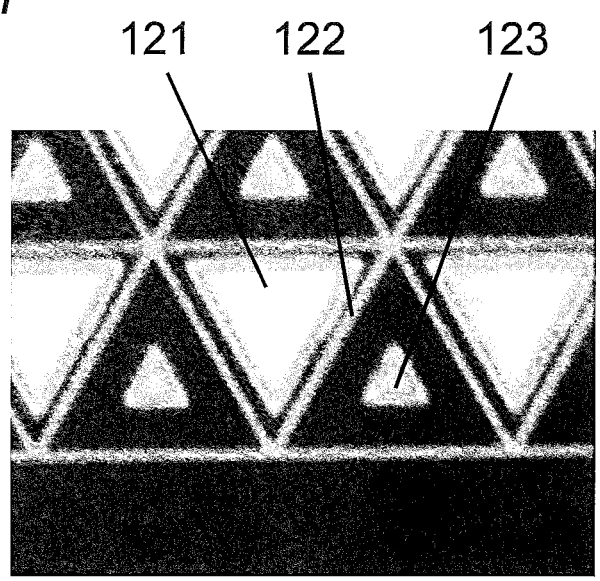
FIG. 11 is a drawing substitute photograph showing an electrode structure of a field-effect transistor of comparative example 2.

As comparative example 2, a field-effect transistor in which an electrode structure shown in FIG. 11 is formed in the range of 1 mm squares on the first surface of a semiconductor layer is produced.

As shown in FIG. 11, a field-effect transistor which is composed of 1116 unit elements so that each of unit elements includes a gate electrode 122 having a triangle ring-like shape with a side of about 30 µm, a drain electrode 123 having a triangle shape with a side of about 6 µm and a source electrode 121 having a triangle shape with about 23 µm is produced.

In comparative example 2, the source electrode formation region and the drain electrode formation region have the same area.

The respective distances between electrodes are as follows:
Source electrode 121-gate electrode 122 distance: 2 µm
Gate length (width of gate electrode 122): 1 µm
Gate electrode 122-drain electrode 123 distance: 7 µm As comparative example 3, a field-effect transistor in which an electrode structure shown in FIG. 12 is formed in the range of 1 mm squares on the first surface of a semiconductor layer is produced.

Figure 12:
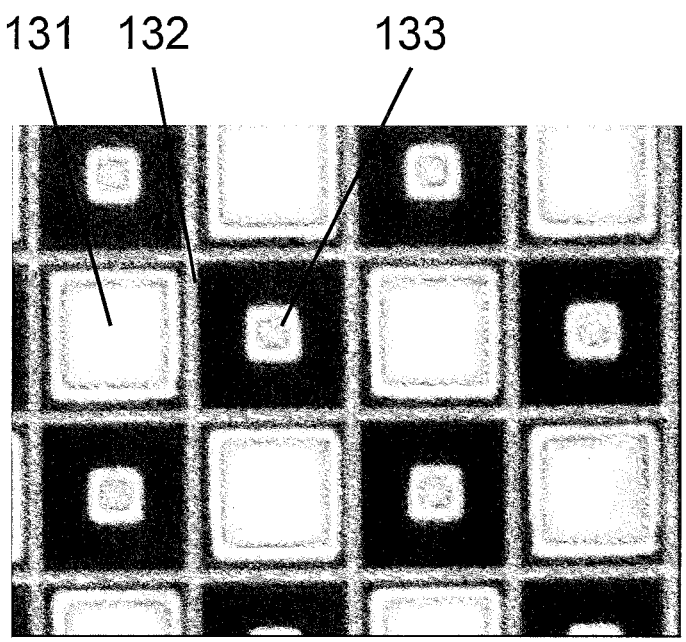
FIG. 12 is a drawing substitute photograph showing an electrode structure of a field-effect transistor of comparative example 3.

As shown in FIG. 12, as comparative example 3, a field-effect transistor which is composed of 1152 unit elements so that each of unit element includes a gate electrode 132 having a quadrangle ring-like shape with a side of about 20 µm, a drain electrode 133 having a quadrangle shape with a side of about 6 µm and a source electrode 131 having a quadrangle shape with a side of about 16 µm is produced.

In comparative example 3, the source electrode formation region and the drain electrode formation region have the same area.

Figure 8:
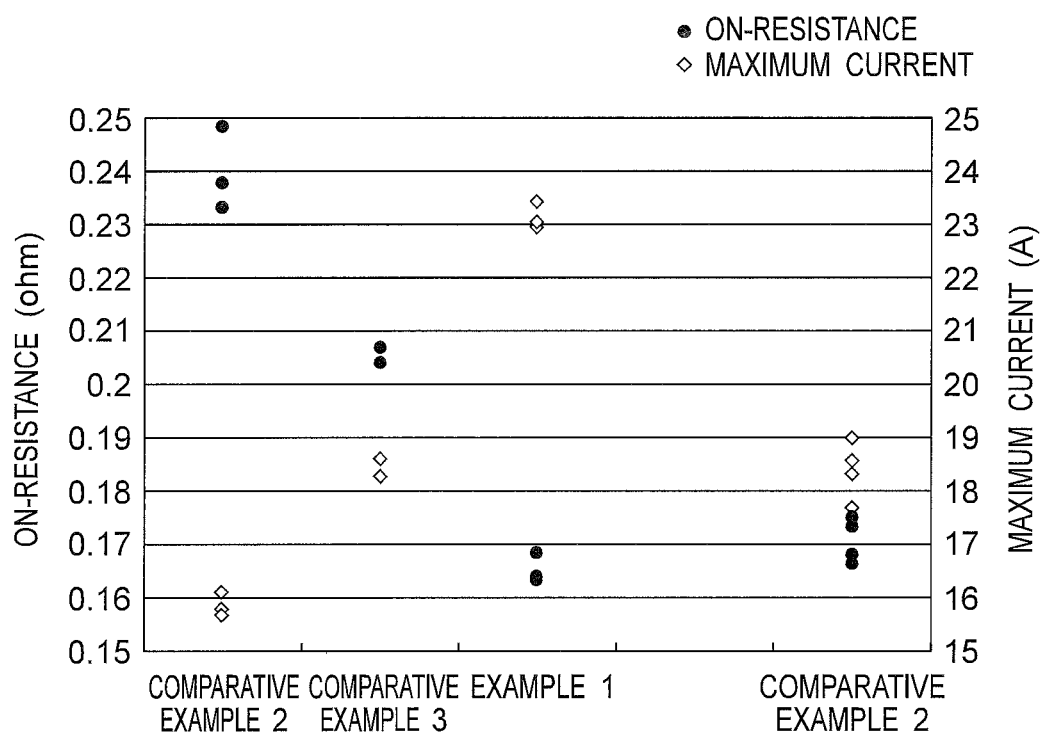
FIG. 8 is a graph showing on resistances and maximum currents of field-effect transistors of Example 1 and comparative examples 1-3.

In comparative example 3, the respective distances between the electrodes are as follows:
Source electrode 131—the gate electrode 132 distance: 2 µm
The gate length (the width of the gate electrode 132): 1 µm
Gate electrode 132—the drain electrode 133 distance: 7 µm As shown in FIG. 8, the field-effect transistor of Example 1 produced in the above-mentioned manner has a low on resistance and a high maximum current.

A field-effect transistor includes a plurality of unit elements. The plurality of unit elements include a semiconductor layer having a first surface; a plurality of gate electrodes provided in a ring-like shape on or above a first surface of a semiconductor layer so as to correspond to the respective unit elements; drain electrodes provided on the first surface so as to be disposed in respective drain electrode formation regions which are inside regions of the respective gate electrodes; and source electrodes provided on the first surface so as to be disposed outside of the gate electrodes. A source-gate distance between the source electrode and the gate electrode is shorter than a drain-gate distance between the drain electrode and the gate electrode. The source electrodes are disposed so that more than one source electrode of the plurality of the source electrodes corresponds to each of the unit elements and each of the source electrodes is disposed in a source electrode formation region surrounded by the gate electrodes of the adjacent unit elements. The source electrode formation regions are smaller than the drain electrode formation regions.

The field-effect transistor formed in the above-mentioned structure according to an embodiment of the present invention has a plurality of unit elements. In the field-effect transistor, the source-gate distance is shorter than the drain-gate distance, the source electrodes are disposed so that more than one source electrode of the plurality of the source electrodes correspond to the respective unit elements and the source electrode formation regions in which the respective separated source electrodes are formed are smaller than the drain electrode formation regions. As a result, in the field-effect transistor according to the embodiment, the number of unit elements formed per unit area may increase and the total channel width may increase while ensuring the size of drain electrodes not less than required level. Thus, according to the embodiment, a field-effect transistor having a high maximum current and a low on resistance may be obtained.

Obviously, numerous modifications and variations of the present invention are possible in light of the above teachings. It is therefore to be understood that within the scope of the appended claims, the invention may be practiced otherwise than as specifically described herein.

What is claimed is:

1. A field-effect transistor comprising:
a plurality of unit elements comprising:
   a semiconductor layer having a first surface;
   a plurality of gate electrodes provided on or above the first surface, respectively, each of the plurality of gate electrodes being provided to define a drain electrode formation region which is surrounded by each of the plurality of gate electrodes;
   drain electrodes, each of the drain electrodes being provided on the first surface in the drain electrode formation region; and
   source electrodes provided on the first surface to be outside of the plurality of gate electrodes, each of the plurality of unit elements including the source electrodes, each of the source electrodes being disposed in a source electrode formation region surrounded by the plurality of gate electrodes of the plurality of unit elements which are adjacent to each other, a source-gate distance between the each of the source electrodes and the each of the plurality of gate electrodes of the plurality of unit elements being shorter than a drain-gate distance between the each of the drain electrodes and the each of the plurality of gate electrodes, the source electrode formation region being smaller than the drain electrode formation region.

2. The field-effect transistor according to claim 1, wherein the plurality of unit elements are arranged so that centers of the plurality of unit elements coincide with grid points of a triangle grid, respectively.

3. The field-effect transistor according to claim 2, wherein each of the drain electrodes has a hexagonal shape and each of the source electrodes has a triangle shape.

4. The field-effect transistor according to claim 3, wherein a side of each of the drain electrodes is shorter than a side of each of the source electrodes.

5. The field-effect transistor according to claim 1, wherein each of the drain electrodes has a round shape and each of the source electrodes has a deformed triangle shape in which sides are dented in an arc shape.

6. The field-effect transistor according to claim 2, wherein each of the drain electrodes has a round shape and each of the source electrodes has a deformed triangle shape in which sides are dented in an arc shape.

7. The field-effect transistor according to claim 1, wherein the plurality of unit elements are arranged so that centers of the plurality of unit elements coincide with grid points of a quadrangle grid, respectively.

8. The field-effect transistor according to claim 7, wherein each of the drain electrodes has a hexagonal shape and each of the source electrodes has a quadrangle shape.

9. The field-effect transistor according to claim 7, wherein each of the drain electrodes has a round shape and each of the source electrodes has a deformed quadrangle shape in which sides are dented in an arc shape.

10. A field-effect transistor comprising:
a plurality of unit elements comprising:
   a semiconductor layer having a first surface;
   a plurality of gate electrodes provided on or above the first surface, respectively, each of the plurality of gate electrodes being provided to define a drain electrode formation region which is surrounded by each of the plurality of gate electrodes;
   drain electrodes, each of the drain electrodes being provided in a hexagonal shape on the first surface in the drain electrode formation regions; and
   source electrodes provided in a triangle shape or a quadrangle shape on the first surface to be outside of the plurality of gate electrodes, each of the plurality of unit elements including the source electrodes, each of the source electrodes being disposed in a source electrode formation region surrounded by the plurality of gate electrodes of the plurality of unit elements which are adjacent to each other, a source-gate distance between the each of the source electrodes and the each of the plurality of gate electrodes of the plurality of unit elements being shorter than a drain-gate distance between the each of the drain electrodes and the each of the plurality of gate electrodes, the source electrode formation region being smaller than the drain electrode formation region.

11. A field-effect transistor comprising:
a plurality of unit elements comprising:
   a semiconductor layer having a first surface;
   a plurality of gate electrodes provided on or above the first surface, respectively, each of the plurality of gate electrodes being provided to define a drain electrode formation region which is surrounded by each of the plurality of gate electrodes;
   drain electrodes, each of the drain electrodes being provided in a round shape on the first surface in the drain electrode formation region; and
   source electrodes provided in a deformed triangle shape or a deformed quadrangle shape in which sides are dented in an arc shape on the first surface to be outside of the plurality of gate electrodes, each of the plurality of unit elements including the source electrodes, each of the source electrodes being disposed in a source electrode formation region surrounded by the plurality of gate electrodes of the plurality of unit elements which are adjacent to each other, a source-gate distance between the each of the source electrodes and the each of the plurality of gate electrodes of the plurality of unit elements being shorter than a drain-gate distance between the each of the drain electrodes and the each of the plurality of gate electrodes, the source electrode formation region being smaller than the drain electrode formation region.

* * * * *